US012725642B2

(12) United States Patent
Chen et al.

(10) Patent No.: US 12,725,642 B2
(45) Date of Patent: Sep. 1, 2026

(54) MEMORY DEVICE, OPERATION METHOD OF THE SAME AND MEMORY SYSTEM

(71) Applicant: MACRONIX INTERNATIONAL CO., LTD., Hsinchu (TW)

(72) Inventors: Kuan-Chih Chen, New Taipei City (TW); Ming-Hsiu Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 228 days.

(21) Appl. No.: 18/809,451

(22) Filed: Aug. 20, 2024

(65) Prior Publication Data

US 2026/0057917 A1 Feb. 26, 2026

(51) Int. Cl.
*G11C 7/10* (2006.01)
*G11C 5/14* (2006.01)

(52) U.S. Cl.
CPC ............ *G11C 7/1078* (2013.01); *G11C 5/145* (2013.01)

(58) Field of Classification Search
CPC .............................. G11C 7/1078; G11C 5/145
USPC .................................................... 365/189.16
See application file for complete search history.

(56) References Cited

U.S. PATENT DOCUMENTS 9,941,014 B2 4/2018 Lee
10,049,748 B2 * 8/2018 Hong .................... G11C 16/08
12,068,047 B2 * 8/2024 Kang .................... G11C 16/14
2017/0330860 A1 * 11/2017 Shim ................. G11C 16/0466
2018/0075912 A1 3/2018 Shimizu
2018/0358098 A1 12/2018 Cha
2021/0011842 A1 1/2021 Lee
2023/0253050 A1 * 8/2023 Kim .................. G11C 16/0483 365/189.011

OTHER PUBLICATIONS

C. C. Lu et al., "Analysis and Realization of TLC or even QLC Operation with a High Performance Multi-times Verify Scheme in 3D NAND Flash memory," 2018 IEEE International Electron Devices Meeting (IEDM), 2018, pp. 2.2.1-2.2.4.

* cited by examiner

*Primary Examiner* — Amir Zarabian
(74) *Attorney, Agent, or Firm* — McClure, Qualey & Rodack, LLP

(57) ABSTRACT

A memory device comprising a memory array, a voltage generator and an array control circuit is provided. The memory array is coupled to the voltage generator and comprises first and second arrays. The array control circuit is coupled to the memory array and the voltage generator, and configured to: in a programming stage, control the voltage generator to generate a first control voltage, and generate a temporary address to control the first array to store storage data and address data in a first programming step according to the temporary address and the first control voltage; in an idle stage, control the voltage generator to generate a second control voltage, and control the second array to store storage data in a second programming step according to address data and the second control voltage. The voltage of the first programming step is greater than the voltage of the second programming step.

20 Claims, 6 Drawing Sheets

First array

Second array

Sub-block

Sub-block

Sub-block

MEMORY DEVICE, OPERATION METHOD OF THE SAME AND MEMORY SYSTEM

BACKGROUND

Technical Field

The present disclosure relates to storing technology of memory devices. More particularly, the present disclosure relates to memory devices, operation method of the same and memory systems that use a plurality of sub-blocks to (temporarily) store data in different stages.

Description of Related Art

With the development of Internet of things (IoT) and 5G technologies, the amount of data involved in computing is becoming larger and larger, and thus the storing speed required by memory devices is also gradually increasing. In order to optimize the storing speed of memory devices, in some instances, the programming speed of memory devices is designed by incremental step pulse programming (ISPP).

However, the step size of the ISPP of the memory device will affect the distribution of the output voltages of the memory array, thereby affecting the reliability of the memory device during operation. This trade-off also makes memory devices need to choose between ISPP step size and reliability. Therefore, how to reduce the correlation between ISPP step size and reliability is one of the topics in this field.

SUMMARY

A memory device is provided in the present disclosure. The memory device comprises a memory array, a voltage generator and an array control circuit. The memory array comprises a first array and a second array. The voltage generator is coupled to the memory array. The array control circuit is coupled to the memory array and the voltage generator, and is configured to: in a programming stage of the memory array, control the voltage generator to generate a first control voltage to the memory array, and generate a temporary address to control the first array to store a storage data and an address data in a first programming step according to the temporary address and the first control voltage; in an idle stage of the memory array, control the voltage generator to generate a second control voltage to the memory array, control the second array to store the storage data in a second programming step according to the address data and the second control voltage, and control the first array to perform an erasing operation. A voltage value of the first programming step is greater than a voltage value of the second programming step.

In some embodiments of the memory device, the memory device further comprises an input circuit. The input circuit is coupled to the memory array and the array control circuit, and is configured to split an input data into the storage data and the address data.

In some embodiments of the memory device, the memory device further comprising a sensing/adjusting circuit. The sensing/adjusting circuit is coupled to the voltage generator and the array control circuit, and is configured to adjust the voltage value of the first programming step and the voltage value of the second programming step according to at least one adjustment parameter in the programming stage and the idle stage.

In some embodiments of the memory device, the memory array is configured to generate a plurality of first output voltages based on the first control voltage. The plurality of first output voltages form a plurality of first subsets that do not overlap with each other in an output voltage-count graph. The memory array is configured to generate a plurality of second output voltages based on the second control voltage. The plurality of second output voltages form a plurality of second subsets that do not overlap with each other in the output voltage-count graph.

In some embodiments of the memory device, the spacing between adjacent two of the plurality of first subsets is negatively related to the voltage value of the first programming step, and the spacing between adjacent two of the plurality of second subsets is negatively related to the voltage value of the second programming step.

In some embodiments of the memory device, the memory array is divided into a plurality of sub-blocks by a plurality of word lines. One of the plurality of sub-blocks is at least partially configured as the first array, and the remaining at least one of the plurality of sub-blocks is configured as the second array.

In some embodiments of the memory device, the memory array is divided into a plurality of sub-blocks by a plurality of word lines. A first block of each of the plurality of sub-blocks is configured as the first array, and a second block of each of the plurality of sub-blocks is configured as the second array.

In some embodiments of the memory device, the voltage value of the first programming step is between 1 volt and 3 volts.

An operation method is provided in the present disclosure. The operation method is suitable for a memory device and comprises: receiving, by a memory array of the memory device, a storage data and an address data; activating, by an array control circuit of the memory device, a voltage generator of the memory device, in a programming stage of the memory array, so as to generate a first control voltage to the memory array; generating, by the array control circuit, a temporary address, in the programming stage, so as to control a first array of the memory array to store the storage data and the address data in a first programming step according to the temporary address and the first control voltage; activating, by the array control circuit, the voltage generator, in an idle stage of the memory array, so as to generate a second control voltage to the memory array; controlling, by the array control circuit, a second array of the memory array to store the storage data in a second programming step according to the address data and the second control voltage, in the idle stage; and controlling, by the array control circuit, the first array to perform an erasing operation, in the idle stage. A voltage value of the first programming step is greater than a voltage value of the second programming step.

In some embodiments of the operation method, receiving, by the memory array of the memory device, the storage data and the address data comprises: receiving, by an input circuit of the memory device, an input data; splitting, by the input circuit, the input data into the storage data and the address data; and transmitting, by the input circuit, the storage data and the address data to the memory array.

In some embodiments of the operation method, the operation method further comprises: adjusting, by a sensing/adjusting circuit of the memory device, the voltage value of the first programming step according to at least one adjustment parameter, in the programming stage; and adjusting, by the sensing/adjusting circuit, the voltage value of the second programming step according to the at least one adjustment parameter, in the idle stage.

In some embodiments of the operation method, the operation method further comprises: generating, by the memory array, a plurality of first output voltages based on the first control voltage, wherein the plurality of first output voltages form a plurality of first subsets that do not overlap with each other in an output voltage-count graph; and generating, by the memory array, a plurality of second output voltages based on the second control voltage, wherein the plurality of second output voltages form a plurality of second subsets that do not overlap with each other in the output voltage-count graph.

In some embodiments of the operation method, the spacing between adjacent two of the plurality of first subsets is negatively related to the voltage value of the first programming step, and the spacing between adjacent two of the plurality of second subsets is negatively related to the voltage value of the second programming step.

In some embodiments of the operation method, the operation method further comprises: dividing, by a plurality of word lines of the memory device, the memory array into a plurality of sub-blocks; configuring, by the array control circuit, one of the plurality of sub-blocks at least partially as the first array; and configuring, by the array control circuit, the remaining at least one of the plurality of sub-blocks as the second array.

In some embodiments of the operation method, the operation method further comprises: dividing, by a plurality of word lines of the memory device, the memory array into a plurality of sub-blocks; configuring, by the array control circuit, a first block of each of the plurality of sub-blocks as the first array; and configuring, by the array control circuit, a second block of each of the plurality of sub-blocks as the second array.

In some embodiments of the operation method, the voltage value of the first programming step is between 1 volt and 3 volts.

A memory system is provided in the present disclosure. The memory system comprises a plurality of memory devices. Each of the plurality of memory devices comprises a memory array, a voltage generator and an array control circuit. The voltage generator is coupled to the memory array. The array control circuit is coupled to the memory array and the voltage generator. The memory array of at least one first memory device among the plurality of memory devices is configured as a first array, and the memory array of at least one second memory device among the plurality of memory devices is configured as a second array. In a programming stage of the memory system, the array control circuit of the at least one first memory device is configured to control the voltage generator of the at least one first memory device to generate a first control voltage to the first array, and is configured to generate a temporary address to the first array to control the first array to store a storage data and an address data in a first programming step according to the temporary address and the first control voltage. In an idle stage of the memory system, the array control circuit of the at least one second memory device is configured to control the voltage generator of the at least one second memory device to generate a second control voltage to the second array, and is configured to control the second array to store the storage data in a second programming step according to the address data and the second control voltage, and the array control circuit of the at least one first memory device is configured to control the first array to perform an erasing operation. A voltage value of the first programming step is greater than a voltage value of the second programming step.

In some embodiments of the memory system, each of the plurality of memory devices further comprises an input circuit. The input circuit is coupled to the memory array and the array control circuit, and is configured to split an input data into the storage data and the address data.

In some embodiments of the memory system, each of the plurality of memory devices further comprises a sensing/adjusting circuit. The sensing/adjusting circuit is coupled to the voltage generator and the array control circuit, and is configured to adjust the voltage value of the first programming step and the voltage value of the second programming step according to at least one adjustment parameter in the programming stage and the idle stage.

In some embodiments of the memory system, the memory array is configured to generate a plurality of first output voltages based on the first control voltage, the plurality of first output voltages form a plurality of first subsets that do not overlap with each other in an output voltage-count graph. The memory array is configured to generate a plurality of second output voltages based on the second control voltage, the plurality of second output voltages form a plurality of second subsets that do not overlap with each other in the output voltage-count graph. The spacing between adjacent two of the plurality of first subsets is negatively related to the voltage value of the first programming step, and the spacing between adjacent two of the plurality of second subsets is negatively related to the voltage value of the second programming step.

With the memory device, the operation method of the same and the memory system in the present disclosure, the memory array can be divided into arrays respectively configured to temporarily store data and store data, and theses arrays can perform ISPP in different step sizes, thereby effectively increasing the speed of data storing while maintaining reliability.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

FIG. 5A is a schematic diagram of the configuration of the first array and the second array in the memory array in accordance with some embodiments of the present disclosure.

FIG. 5B is a schematic diagram of the configuration of the first array and the second array in the memory array in accordance with some embodiments of the present disclosure.

FIG. 5C is a schematic diagram of the configuration of the first array and the second array in the memory array in accordance with some embodiments of the present disclosure.

FIG. 5D is a schematic diagram of the configuration of the first array and the second array in the memory array in accordance with some embodiments of the present disclosure.

FIG. 5E is a schematic diagram of the configuration of the first array and the second array in the memory array in accordance with some embodiments of the present disclosure.

FIG. 5F is a schematic diagram of the configuration of the first array and the second array in the memory array in accordance with some embodiments of the present disclosure.

DETAILED DESCRIPTION

Reference will now be made in detail to the present embodiments of the disclosure, examples of which are illustrated in the accompanying drawings.

In the present disclosure, when an element is referred to as "connected", it may mean "electrically connected" or "optical connected". When an element is referred to as "coupled", it may mean "electrically coupled" or "optical coupled". "Connected" or "coupled" can also be used to indicate that two or more components operate or interact with each other. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Figure 1:
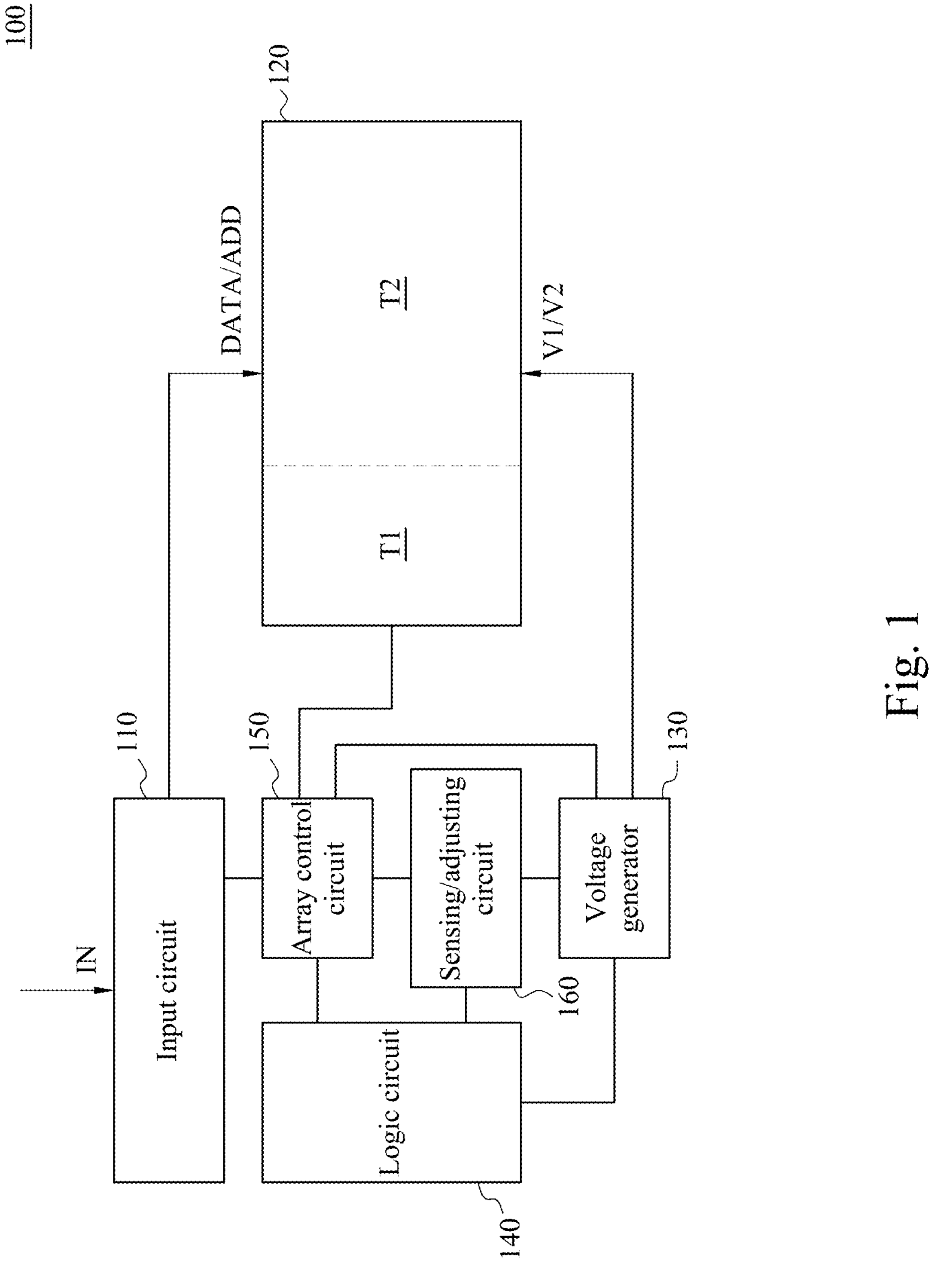
FIG. 1 is a functional block diagram of a memory device in accordance with some embodiments of the present disclosure.

FIG. 1 is a functional block diagram of a memory device 100 in accordance with some embodiments of the present disclosure. In some embodiments, the memory device 100 comprises an input circuit 110, a memory array 120, a voltage generator 130, a logic circuit 140, an array control circuit 150 and a sensing/adjusting circuit 160.

The input circuit 110 is coupled to the memory array 120 and the array control circuit 150, and is configured to receive the input data IN, split the input data IN into storage data DATA and address data ADD, and transmit the split storage data DATA and address data ADD to the memory array 120. In some embodiments, after receiving the input data IN, the input circuit 110 sends a signal to the array control circuit 150 to instruct the array control circuit 150 to perform corresponding operations (which will be described in detail in subsequent paragraphs).

The memory array 120 is coupled to the input circuit 110, the voltage generator 130 and the array control circuit 150, and is configured to receive the storage data DATA and the address data ADD from the input circuit 110, configured to receive control voltages V1 and V2 from the voltage generator 130, configured to receive a temporary address (not shown) from the array control circuit 150, and configured to temporarily store and read the storage data DATA according to the address data ADD, the control voltages V1, V2 and the temporary address.

In some embodiments, the memory array 120 may be implemented with a two-dimensional memory array, a three-dimensional memory array, or a combination of aforementioned elements. In addition, it should be noted that in some embodiments, the memory array 120 further comprises word line decoders and bit line decoders. For the brevity of the figure, these elements are omitted in FIG. 1.

In some embodiments, the memory array 120 comprises a first array T1 and a second array T2. The first array T1 and the second array T2 are respectively configured to temporarily store and store the data DATA during different operating stages of the memory array 120.

Specifically, first, in a programming stage, the memory array 120 is configured to perform incremental step pulse programming (ISPP) in a first programming step, so as to temporarily store the storage data DATA in the first array T1 which acts as a buffer; then, when the memory array 120 enters an idle stage, the memory array 120 is configured to perform ISPP in a second programming step, so as to store (i.e., transfer) the storage data DATA temporarily stored in the first array T1 into the second array T2, so that the second array T2 can operate in the background. In addition, the memory array 120 may also erase the storage data DATA temporarily stored in the first array T1 at this time. In some embodiments, each of the first programming step and the second programming step is a specific voltage value.

The voltage generator 130 is coupled to the memory array 120, the logic circuit 140, the array control circuit 150 and the sensing/adjusting circuit 160, and is configured to generate control voltages V1 and V2 to the memory array 120 according to the control of the logic circuit 140, the array control circuit 150 and the sensing/adjusting circuit 160.

The logic circuit 140 is coupled to the voltage generator 130, the array control circuit 150 and the sensing/adjusting circuit 160, and is configured to control the voltage generated by the voltage generator 130 according to the activation of the array control circuit 150 and the adjustment of the sensing/adjusting circuit 160.

The array control circuit 150 is coupled to the input circuit 110, the memory array 120, the voltage generator 130, the logic circuit 140 and the sensing/adjusting circuit 160, and is configured to receive signals from the input circuit 110 to generate the temporary address, and activate the voltage generator 130 and the logic circuit 140 to control the voltage generator 130 to generate voltages. In some embodiments not shown, the array control circuit 150 may be disposed in the logic circuit 140.

The sensing/adjusting circuit 160 is coupled to the voltage generator 130, the logic circuit 140 and the array control circuit 150, and is configured to sense adjustment parameters of the memory device 100 (e.g., temperature, pressure, number of usage cycles, disturbance during reading, etc.), and adjust the step size of the memory array 120 when performing incremental step pulse programming (ISPP) according to these adjustment parameters. In some embodiments, the sensing/adjusting circuit 160 may be omitted.

Figure 2:
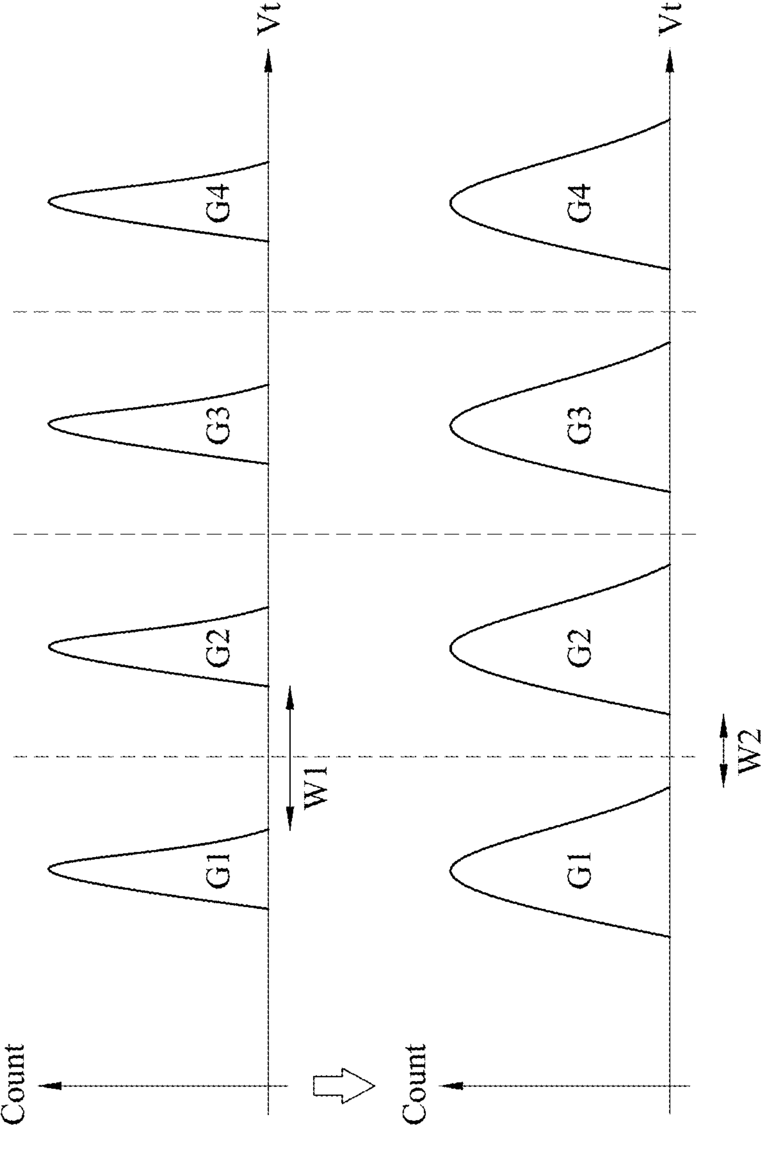
FIG. 2 is an output voltage-count diagram of a plurality of subsets of output voltages in accordance with some embodiments of the present disclosure.

In some embodiments, the groups of data stored in the memory array 120 can be distinguished by its output voltage. In other words, the voltages output by the memory array 120 can be grouped to correspond to different data respectively. FIG. 2 is an output voltage-count diagram of subsets G1-G4 of output voltages Vt of the memory array 120 in accordance with some embodiments of the present disclosure.

First, please refer to the top half of FIG. 2. In some embodiments, by counting the types and quantities of the output voltages Vt of the memory array 120, the output voltages Vt can be divided into a plurality of non-overlapping subsets (e.g., subsets G1-G4), and each subset corresponds to a type of data. Therefore, the subsets G1-G4 in FIG. 2 can be configured to distinguish four types of data.

However, the distribution of the output voltages Vt may change due to various factors (e.g., increase in device temperature, increase in the number of usage cycles, disturbance during reading, etc.). Specifically, please refer to the lower half of FIG. 2. Under the influence of the aforementioned factors, the distribution of the output voltages Vt of the memory array 120 will gradually become dispersed, that is, the width of the subsets G1-G4 will increase. As the width of each subset increases, the spacing between two adjacent subsets will decrease (e.g., from spacing W1 to spacing W2). When two adjacent subsets overlap, since the same output voltage Vt may correspond to two subsets, the memory device 100 will suffer from data resolution errors.

In order to avoid the overlapping of adjacent subsets under the influence of the aforementioned factors, a larger spacing is required between subsets. In some embodiments, the step size of the memory array 120 when performing incremental step pulse programming (ISPP) is negatively related to the spacing between the plurality of subsets of the output voltages Vt. In other words, when the step size of ISPP is smaller, the spacing between adjacent subsets is larger, and the reliability of the memory device is higher.

Figure 3:
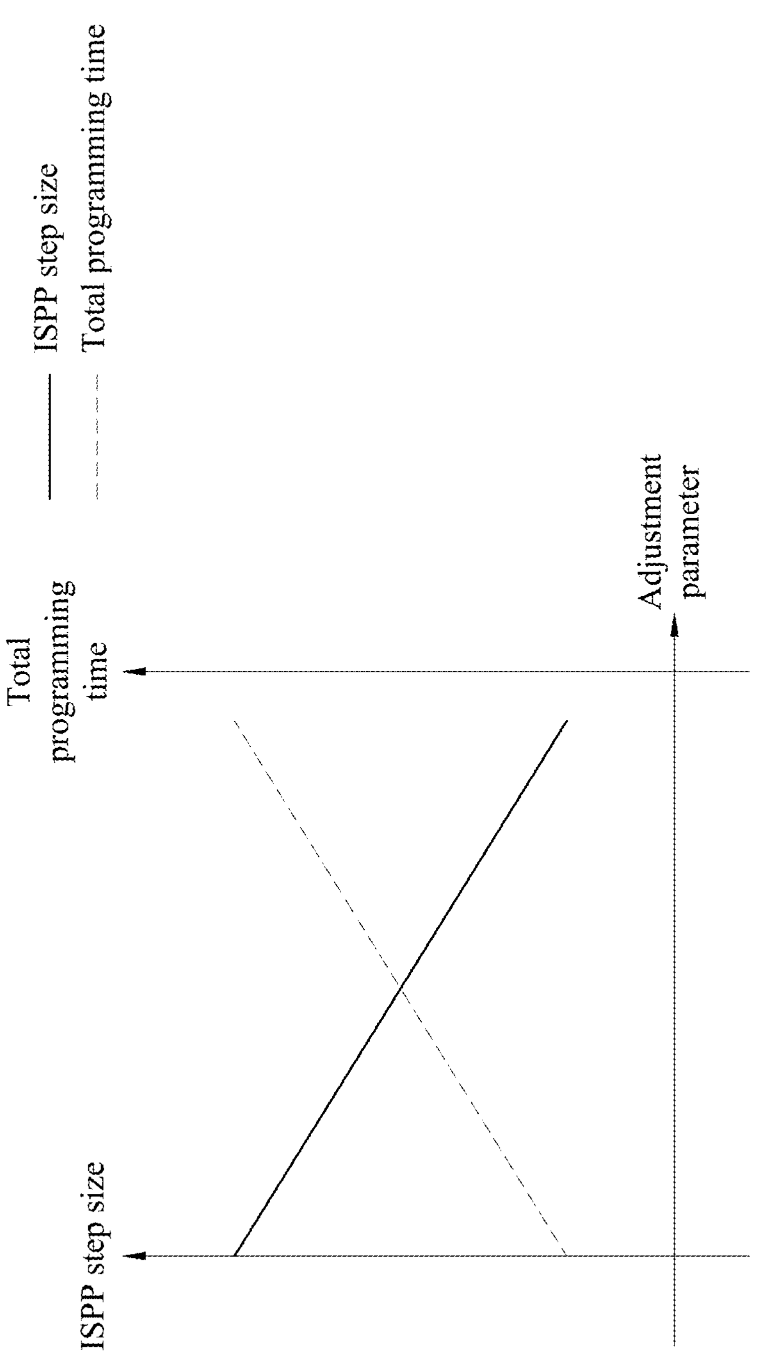
FIG. 3 is a schematic diagram of the relationship between the adjustment parameter, the step size of ISPP and the total programming time in accordance with some embodiments of the present disclosure.

FIG. 3 is a schematic diagram of the relationship between the adjustment parameter, the step size of ISPP and the total programming time in accordance with some embodiments of the present disclosure. As shown in FIG. 3, the step size of ISPP can be adjusted along with the adjustment parameters (e.g., the aforementioned device temperature, number of usage cycles, disturbance during reading, etc.). However, when the step size of ISPP decreases, it means that the time required to complete ISPP will increase, thereby increasing the total programming time of the memory device.

In order to optimize the relationship between the ISPP step size (i.e., reliability) and the programming efficiency of the memory device. The memory device 100 provided in the present disclosure can achieve improved efficiency by dividing the memory array 120 into two different arrays and performing ISPP in different step sizes.

Figure 4:
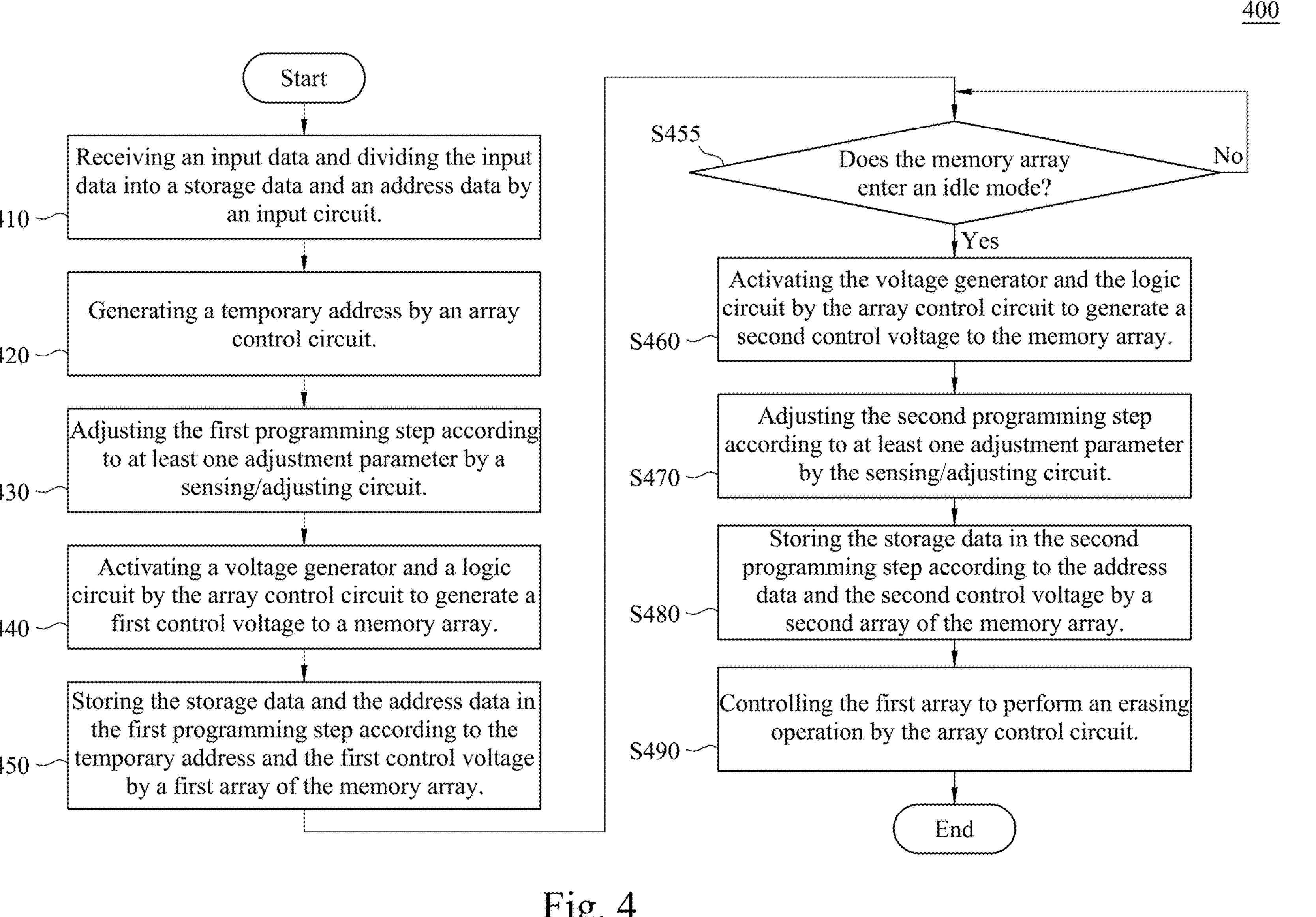
FIG. 4 is a flowchart of an operation method of the memory device in accordance with some embodiments of the present disclosure.

FIG. 4 is a flowchart of an operation method 400 of the memory device in accordance with some embodiments of the present disclosure. In some embodiments, the operation method 400 is suitable for a memory device (e.g., the memory device 100 in FIG. 1) and comprises steps S410, S420, S430, S440, S450, S455, S460, S470, S480 and S490.

In step S410, an input data is received, split into a storage data and an address data, and transmitted to a memory array (e.g., the memory array 120 in FIG. 1), and a signal is transmitted to an array control circuit (e.g., the array control circuit 150 in FIG. 1), by an input circuit (e.g., the input circuit 110 in FIG. 1). Next, step S420 will be performed.

In step S420, a signal from the input circuit is received, and a temporary address is generated toward the memory array, by the array control circuit. Next, step S430 will be performed.

In step S430, at least one adjustment parameter (e.g., temperature, pressure, number of usage cycles, disturbance during reading, etc.) is detected, and a first programming step is adjusted according to the detected adjustment parameter, by a sensing/adjusting circuit (e.g., the sensing/adjusting circuit 160 in FIG. 1). Next, step S440 will be performed.

In step S440, a voltage generator (e.g., the voltage generator 130 in FIG. 1) and a logic circuit are activated by the array control circuit, so that the voltage generator generates a first control voltage (e.g., the control voltage V1 in FIG. 1) to the memory array. Next, step S450 will be performed.

In step S450, an ISPP is performed in the first programming step according to the temporary address and the first control voltage by a first array of the memory array (e.g., the first array T1 in FIG. 1), so as to temporarily store the storage data and the address data. Next, step S455 will be performed. In some embodiments, the steps from step S410 to step S450 may be referred to as a programming stage of the memory array.

In step S455, the array control circuit determines whether the memory array has completed the programming stage (i.e., the storage data and address data are temporarily stored in the first array). If the array control circuit determines that the memory array has completed the programming stage, step S460 will be performed; if the array control circuit determines that the memory array has not completed the programming stage, step S455 will be repeatedly performed.

In step S460, the voltage generator and the logic circuit are activated again by the array control circuit, so that the voltage generator generates a second control voltage (e.g., the control voltage V2 in FIG. 1) to the memory array. Next, step S470 will be performed.

In step S470, the adjustment parameter is detected again, and a second programming step is adjusted according to the detected adjustment parameter, by the sensing/adjusting circuit. Next, step S480 will be performed.

In step S480, an ISPP is performed in the second programming step according to the address data and the second control voltage by a second array of the memory array (e.g., the second array T2 in FIG. 1), so as to store the storage data. Next, step S490 will be performed.

In step S490, the first array is controlled by the array control circuit to perform an erasing operation, so as to erase the storage data and address data temporarily stored in the first array. In some embodiments, the steps from step S460 to step S490 may be referred to as an idle stage of the memory array.

It is worth noting that since the storage data and address data are only temporarily stored in the first array during the programming stages, the first array will not store data for a long time, and will not be read and written multiple times, thus the stress on the first array is relatively small. Therefore, a higher voltage can be applied for the first programming step to increase the programming speed. In some embodiments, the voltage value of the first programming step is between 1 volt and 3 volts.

In contrast, since the second array is configured to store data for a long time, it has greater stress. Therefore, in some embodiments, the voltage value of the second programming step is lower than the voltage value of the first programming step (i.e., using a smaller voltage in the idle stage), so as to increase the reliability of the memory device.

It should be noted that the number and order of steps in the operation method 400 in the present disclosure are only examples, and are not intended to limit the present disclosure. Other numbers and order of steps are within the scope of the present disclosure. In some embodiments, step S430 and step S470 may be omitted. In some embodiments, the operation method 400 further comprises step S456 between step S455 and step S460: the storage data and address data are transmitted back to the array control circuit by the first array.

By dividing the memory array into two arrays and performing ISPP on the two arrays in different programming steps, the memory device 100 in the present disclosure can increase the programming speed while maintaining stable reliability. In addition, by using one array as a buffer to temporarily store data and the other array to store data in the background, the memory device 100 in the present disclosure can also improve the efficiency of data storage.

FIGS. 5A-5F are schematic diagrams of configurations of the first array and the second array in the memory array in accordance with some embodiments of the present disclosure. In the embodiments of FIGS. 5A-5F, the memory array is implemented with a three-dimensional memory array, and the memory array is divided into a plurality of sub-blocks by a plurality of word lines (not shown).

Figures 5A, 5B, 5C, 5D, 5E, 5F:
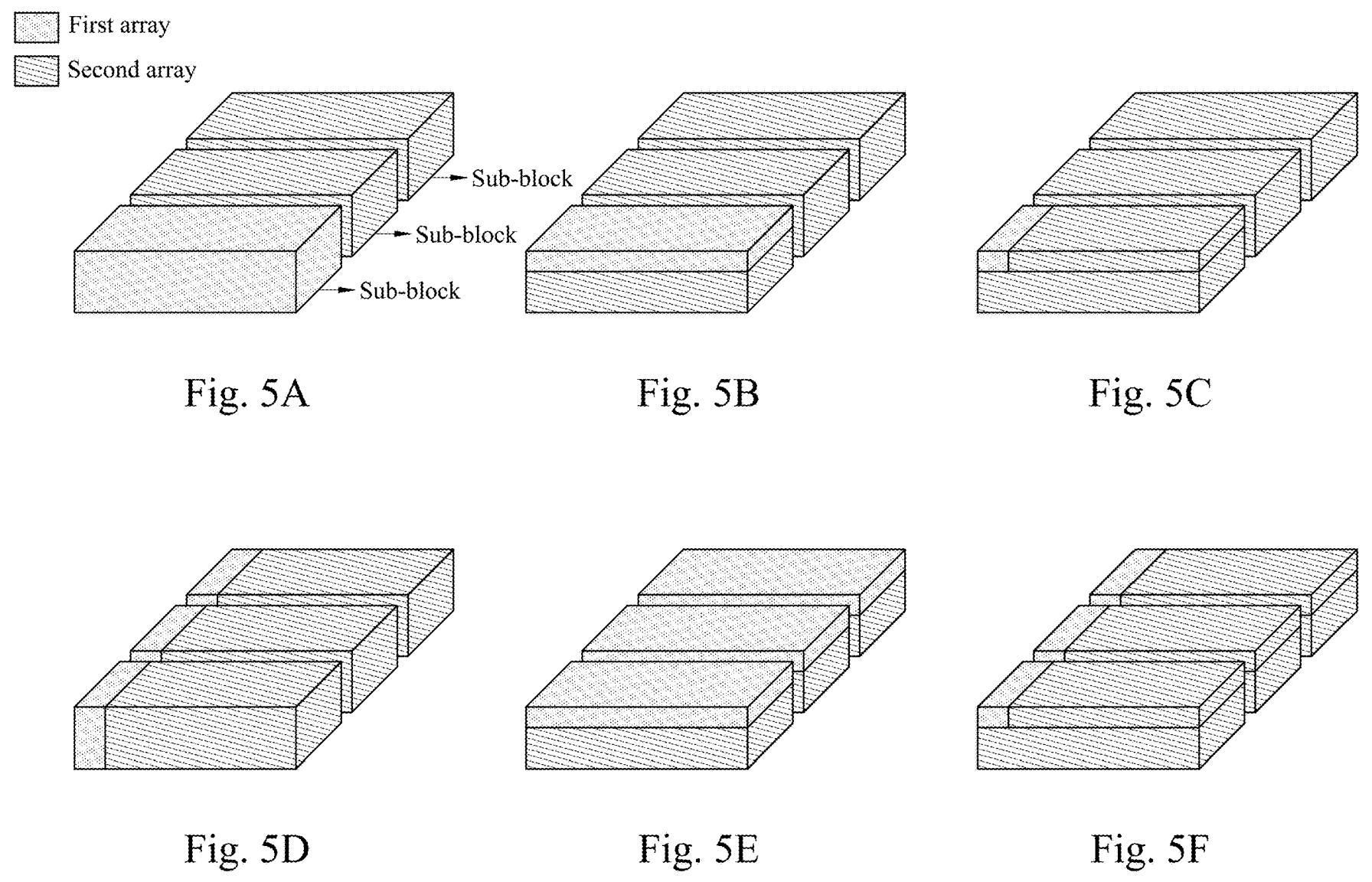

In the embodiments of FIGS. 5A-5C, at least part of one of the sub-blocks of the memory array is configured as the first array, and the remaining part of this sub-block and other sub-blocks are configured as the second array. For example, in the embodiment of FIG. 5A, a complete sub-block is configured as the first array, and other sub-blocks are configured as the second array; in the embodiment of FIG. 5B, a specific layer in one sub-block is configured as the first array, and the other layers of this sub-block and the other sub-blocks are configured as the second array; in the embodiment of FIG. 5C, a plurality of memory cells sharing the same specific bit line (not shown) in a specific layer of one sub-block is configured as the first array, and the other memory cells of this sub-block and the other sub-blocks are configured as the second array.

In the embodiments of FIGS. 5D-5F, at least part of each sub-block of the memory array is configured as the first array, and the remaining part of the sub-blocks is configured as the second array. For example, in the embodiment of FIG. 5D, a plurality of memory cells sharing the same specific bit line (not shown) in each sub-block are configured as the first array, and the other memory cells in the sub-blocks are configured as the second array; in the embodiment of FIG. 5E, a specific layer in each sub-block is configured as the first array, and the other layers of the sub-blocks are configured as the second array; in the embodiment of FIG. 5F, a plurality of memory cells sharing the same specific bit line (not shown) in a specific layer of each sub-block are configured as the first array, and the other memory cells in the sub-blocks are configured as the second array.

It should be noted that the configurations of the first array and the second array in FIGS. 5A-5F are only examples, and are not intended to limit the present disclosure. Other configurations of the first array and the second array are within the scope of the present disclosure. In some embodiments, the first array may be configured to be located at a lower layer or right side of the sub-block. In other embodiments, the first array may be configured to surround the second array.

Figure 6:
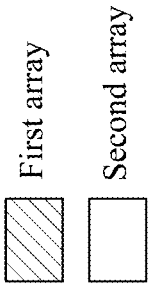
FIG. 6 is a schematic diagram of the configuration of the first array and the second array in a memory system in accordance with some embodiments of the present disclosure.
Figure 6:
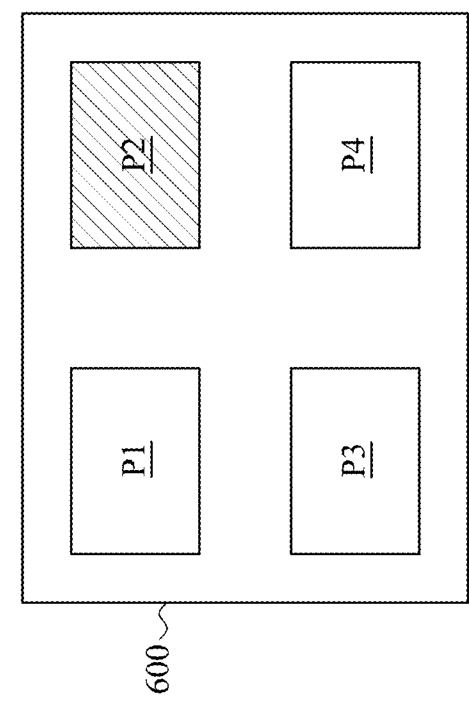

FIG. 6 is a schematic diagram of the configuration of the first array and the second array in a memory system 600 in accordance with some embodiments of the present disclosure. In some embodiments, the memory system 600 may be implemented with a chip comprising planes P1-P4, wherein each of the planes P1-P4 may be implemented with a memory device (e.g., the memory device 100 in FIG. 1). Therefore, the structure of planes P1-P4 will not be repeated herein.

Compared to FIGS. 5A-5F where at least part of the memory device is configured as the first array and the remaining part is configured as the second array, in the embodiment of FIG. 6, at least one plane (e.g., the plane P2) is configured as the first array, and the other planes (e.g., the planes P1, P3, P4) are configured as the second array. In other words, in the embodiment of FIG. 6, the memory system 600 comprises a plurality of memory devices, and the entire memory array of at least one memory device is configured as the first array, while the entire memory array of the other memory devices is configured as the second array. Therefore, the memory system 600 comprising the plurality of memory devices can perform functions similar to the memory device 100 described above.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A memory device, comprising:
- a memory array, comprising a first array and a second array;
- a voltage generator, coupled to the memory array; and
- an array control circuit, coupled to the memory array and the voltage generator, and configured to:
  - in a programming stage of the memory array:
    - control the voltage generator to generate a first control voltage to the memory array; and
    - generate a temporary address to control the first array to store a storage data and an address data in a first programming step according to the temporary address and the first control voltage,
  - in an idle stage of the memory array:
    - control the voltage generator to generate a second control voltage to the memory array;
    - controlling the second array to store the storage data in a second programming step according to the address data and the second control voltage; and
    - control the first array to perform an erasing operation,
- wherein a voltage value of the first programming step is greater than a voltage value of the second programming step.

2. The memory device of claim 1, further comprising an input circuit, wherein the input circuit is coupled to the memory array and the array control circuit, and is configured to split an input data into the storage data and the address data.

3. The memory device of claim 1, further comprising a sensing/adjusting circuit, wherein the sensing/adjusting circuit is coupled to the voltage generator and the array control circuit, and is configured to adjust the voltage value of the first programming step and the voltage value of the second programming step according to at least one adjustment parameter in the programming stage and the idle stage.

4. The memory device of claim 1, wherein the memory array is configured to generate a plurality of first output voltages based on the first control voltage, the plurality of first output voltages form a plurality of first subsets that do not overlap with each other in an output voltage-count graph, and wherein the memory array is configured to generate a plurality of second output voltages based on the second control voltage, the plurality of second output voltages form a plurality of second subsets that do not overlap with each other in the output voltage-count graph.

5. The memory device of claim 4, wherein the spacing between adjacent two of the plurality of first subsets is negatively related to the voltage value of the first programming step, and the spacing between adjacent two of the plurality of second subsets is negatively related to the voltage value of the second programming step.

6. The memory device of claim 1, wherein the memory array is divided into a plurality of sub-blocks by a plurality of word lines, one of the plurality of sub-blocks is at least partially configured as the first array, and the remaining at least one of the plurality of sub-blocks is configured as the second array.

7. The memory device of claim 1, wherein the memory array is divided into a plurality of sub-blocks by a plurality of word lines, a first block of each of the plurality of sub-blocks is configured as the first array, and a second block of each of the plurality of sub-blocks is configured as the second array.

8. The memory device of claim 1, wherein the voltage value of the first programming step is between 1 volt and 3 volts.

9. An operation method, suitable for a memory device, comprising:

receiving, by a memory array of the memory device, a storage data and an address data;

activating, by an array control circuit of the memory device, a voltage generator of the memory device, in a programming stage of the memory array, so as to generate a first control voltage to the memory array;

generating, by the array control circuit, a temporary address, in the programming stage, so as to control a first array of the memory array to store the storage data and the address data in a first programming step according to the temporary address and the first control voltage;

activating, by the array control circuit, the voltage generator, in an idle stage of the memory array, so as to generate a second control voltage to the memory array;

controlling, by the array control circuit, a second array of the memory array to store the storage data in a second programming step according to the address data and the second control voltage, in the idle stage; and controlling, by the array control circuit, the first array to perform an erasing operation, in the idle stage, wherein a voltage value of the first programming step is greater than a voltage value of the second programming step.

10. The operation method of claim 9, wherein receiving, by the memory array of the memory device, the storage data and the address data comprises:

receiving, by an input circuit of the memory device, an input data;

splitting, by the input circuit, the input data into the storage data and the address data; and transmitting, by the input circuit, the storage data and the address data to the memory array.

11. The operation method of claim 9, further comprising:

adjusting, by a sensing/adjusting circuit of the memory device, the voltage value of the first programming step according to at least one adjustment parameter, in the programming stage; and adjusting, by the sensing/adjusting circuit, the voltage value of the second programming step according to the at least one adjustment parameter, in the idle stage.

12. The operation method of claim 9, further comprising:

generating, by the memory array, a plurality of first output voltages based on the first control voltage, wherein the plurality of first output voltages form a plurality of first subsets that do not overlap with each other in an output voltage-count graph; and generating, by the memory array, a plurality of second output voltages based on the second control voltage, wherein the plurality of second output voltages form a plurality of second subsets that do not overlap with each other in the output voltage-count graph.

13. The operation method of claim 12, wherein the spacing between adjacent two of the plurality of first subsets is negatively related to the voltage value of the first programming step, and the spacing between adjacent two of the plurality of second subsets is negatively related to the voltage value of the second programming step.

14. The operation method of claim 9, further comprising:

dividing, by a plurality of word lines of the memory device, the memory array into a plurality of sub-blocks;

configuring, by the array control circuit, one of the plurality of sub-blocks at least partially as the first array; and configuring, by the array control circuit, the remaining at least one of the plurality of sub-blocks as the second array.

15. The operation method of claim 9, further comprising:

dividing, by a plurality of word lines of the memory device, the memory array into a plurality of sub-blocks;

configuring, by the array control circuit, a first block of each of the plurality of sub-blocks as the first array; and configuring, by the array control circuit, a second block of each of the plurality of sub-blocks as the second array.

16. The operation method of claim 9, wherein the voltage value of the first programming step is between 1 volt and 3 volts.

17. A memory system, comprising a plurality of memory devices, wherein each of the plurality of memory devices comprises:

a memory array;

a voltage generator, coupled to the memory array; and an array control circuit, coupled to the memory array and the voltage generator, wherein the memory array of at least one first memory device among the plurality of memory devices is configured as a first array, and the memory array of at least one second memory device among the plurality of memory devices is configured as a second array, wherein in a programming stage of the memory system, the array control circuit of the at least one first memory device is configured to control the voltage generator of the at least one first memory device to generate a first control voltage to the first array, and is configured to generate a temporary address to the first array to control the first array to store a storage data and an address data in a first programming step according to the temporary address and the first control voltage, wherein in an idle stage of the memory system, the array control circuit of the at least one second memory device is configured to control the voltage generator of the at least one second memory device to generate a second control voltage to the second array, and is configured to control the second array to store the storage data in a second programming step according to the address data and the second control voltage, and the array control circuit of the at least one first memory device is configured to control the first array to perform an erasing operation, wherein a voltage value of the first programming step is greater than a voltage value of the second programming step.

18. The memory system of claim 17, wherein each of the plurality of memory devices further comprises an input circuit, wherein the input circuit is coupled to the memory array and the array control circuit, and is configured to split an input data into the storage data and the address data.

19. The memory system of claim 17, wherein each of the plurality of memory devices further comprises a sensing/adjusting circuit, wherein the sensing/adjusting circuit is coupled to the voltage generator and the array control circuit, and is configured to adjust the voltage value of the first programming step and the voltage value of the second programming step according to at least one adjustment parameter in the programming stage and the idle stage.

20. The memory system of claim 17, wherein the memory array is configured to generate a plurality of first output voltages based on the first control voltage, the plurality of first output voltages form a plurality of first subsets that do not overlap with each other in an output voltage-count graph, wherein the memory array is configured to generate a plurality of second output voltages based on the second control voltage, the plurality of second output voltages form a plurality of second subsets that do not overlap with each other in the output voltage-count graph, and wherein the spacing between adjacent two of the plurality of first subsets is negatively related to the voltage value of the first programming step, and the spacing between adjacent two of the plurality of second subsets is negatively related to the voltage value of the second programming step.

* * * * *